US011651834B2

(12) United States Patent
Lu et al.

(10) Patent No.: US 11,651,834 B2
(45) Date of Patent: May 16, 2023

(54) MEMORY DUTY-CYCLE SKEW MANAGEMENT

(71) Applicant: Micron Technology, Inc., Boise, ID (US)

(72) Inventors: Yang Lu, Boise, ID (US); Zhenming Zhou, San Jose, CA (US); Jiangli Zhu, San Jose, CA (US); Tingjun Xie, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/316,765

(22) Filed: May 11, 2021

(65) Prior Publication Data
US 2022/0366995 A1 Nov. 17, 2022

(51) Int. Cl.
*G11C 29/12* (2006.01)
*G11C 29/44* (2006.01)
*G11C 29/14* (2006.01)
*G11C 8/18* (2006.01)

(52) U.S. Cl.
CPC ............... *G11C 29/44* (2013.01); *G11C 8/18* (2013.01); *G11C 29/12005* (2013.01); *G11C 29/12015* (2013.01); *G11C 29/14* (2013.01); *G11C 2029/4402* (2013.01)

(58) Field of Classification Search
CPC combination set(s) only.
See application file for complete search history.

(56) References Cited

U.S. PATENT DOCUMENTS

| 9,478,303 | B1 | 10/2016 | Parker |
| 10,110,229 | B1 * | 10/2018 | Lau ..................... G11C 7/1087 |
| 10,446,222 | B2 | 10/2019 | Schoenborn et al. |
| 2010/0070221 | A1 * | 3/2010 | Altimus ........... G01R 31/31708 |
| | | | 702/66 |
| 2010/0271092 | A1 | 10/2010 | Zerbe et al. |

(Continued)

FOREIGN PATENT DOCUMENTS

| EP | 2706712 B1 | 6/2017 |
| KR | 1020200016678 A | 2/2020 |

OTHER PUBLICATIONS

PCT International Search Report and Written Opinion for International Application No. PCT/US2022/028617, dated Aug. 18, 2022, 9 pages.

(Continued)

*Primary Examiner* — Mohammed A Bashar
(74) *Attorney, Agent, or Firm* — Lowenstein Sandler LLP

(57) ABSTRACT

A system and method for optimizing a memory sub-system to compensate for memory device degradation. An example system including a memory controller operatively coupled with a memory device and configured to perform operations comprising: updating a setting of the memory device, wherein the setting changes a duty cycle of a signal of the memory device and comprises a first value for a first configuration and comprises a second value for a second configuration; storing error data that indicates errors when using the first configuration and errors when using the second configuration; determining a value for the setting based on the error data, wherein the determined value minimizes errors associated with the memory device; and storing the determined value for the setting of the memory device.

20 Claims, 8 Drawing Sheets

(56) References Cited

U.S. PATENT DOCUMENTS

| | | |
|---|---|---|
| 2011/0227618 A1* | 9/2011 | Miyano ............... G06F 1/04 |
| | | 327/158 |
| 2012/0163074 A1 | 6/2012 | Franca et al. |
| 2013/0173970 A1 | 7/2013 | Kleveland et al. |
| 2015/0146493 A1 | 5/2015 | Davis |
| 2018/0137902 A1 | 5/2018 | Giovannini et al. |
| 2018/0335828 A1 | 11/2018 | Chun et al. |
| 2019/0102086 A1 | 4/2019 | Kanno |
| 2019/0391865 A1 | 12/2019 | Cadloni et al. |
| 2020/0042194 A1 | 2/2020 | Hashimoto |
| 2020/0119721 A1 | 4/2020 | Mozak et al. |
| 2020/0194044 A1 | 6/2020 | Kim |

OTHER PUBLICATIONS

PCT International Search Report and Written Opinion for International Application No. PCT/US2022/028847, dated Sep. 7, 2022, 12 pages.

(toppr.com)—"Range and Mean Deviation for Ungrouped Data: Formulas and Examples" Aug. 5, 2020. (Year: 2020).

* cited by examiner

600

Updating, by a memory controller, a setting of a memory device, wherein the setting changes a duty cycle of a signal of the memory device and comprises a first value for a first configuration and comprises a second value for a second configuration
610

Storing error data that indicates errors when using the first configuration and errors when using the second configuration
620

Determining, by the memory controller, a value for the setting based on the error data, wherein the determined value minimizes errors associated with the memory device
630

Storing, by the memory controller, the determined value for the setting of the memory device
640

```
Testing, by a memory controller, different values for a setting of a
memory device, wherein the setting of the memory device affects a duty
cycle of a signal internal to the memory device
710
```

```
Selecting, by the memory controller, an optimum value for the setting
based on access errors during the testing, wherein the optimum value
minimizes access errors
720
```

```
Determining, by the memory controller, a degradation measurement for
the memory device based on the optimum value
730
```

```
Providing, by the memory controller, a notification based on the
degradation measurement to a host system
740
```

FIG. 7 ately, a host system can utilize a memory sub-system that includes one or more memory devices to store data. The host system can provide data to be stored by the memory devices
MEMORY DUTY-CYCLE SKEW MANAGEMENT

TECHNICAL FIELD

Embodiments of the disclosure relate generally to memory sub-systems, and more specifically, relate to handling degradation of memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 is a flow chart of a method for optimizing a memory sub-system to compensate for memory device degradation, in accordance with some embodiments of the present disclosure.

FIG. 7 is another flow chart of a method for measuring the degradation of one or more memory devices of the memory sub-system, in accordance with some embodiments of the present disclosure.

DETAILED DESCRIPTION

Figure 1:
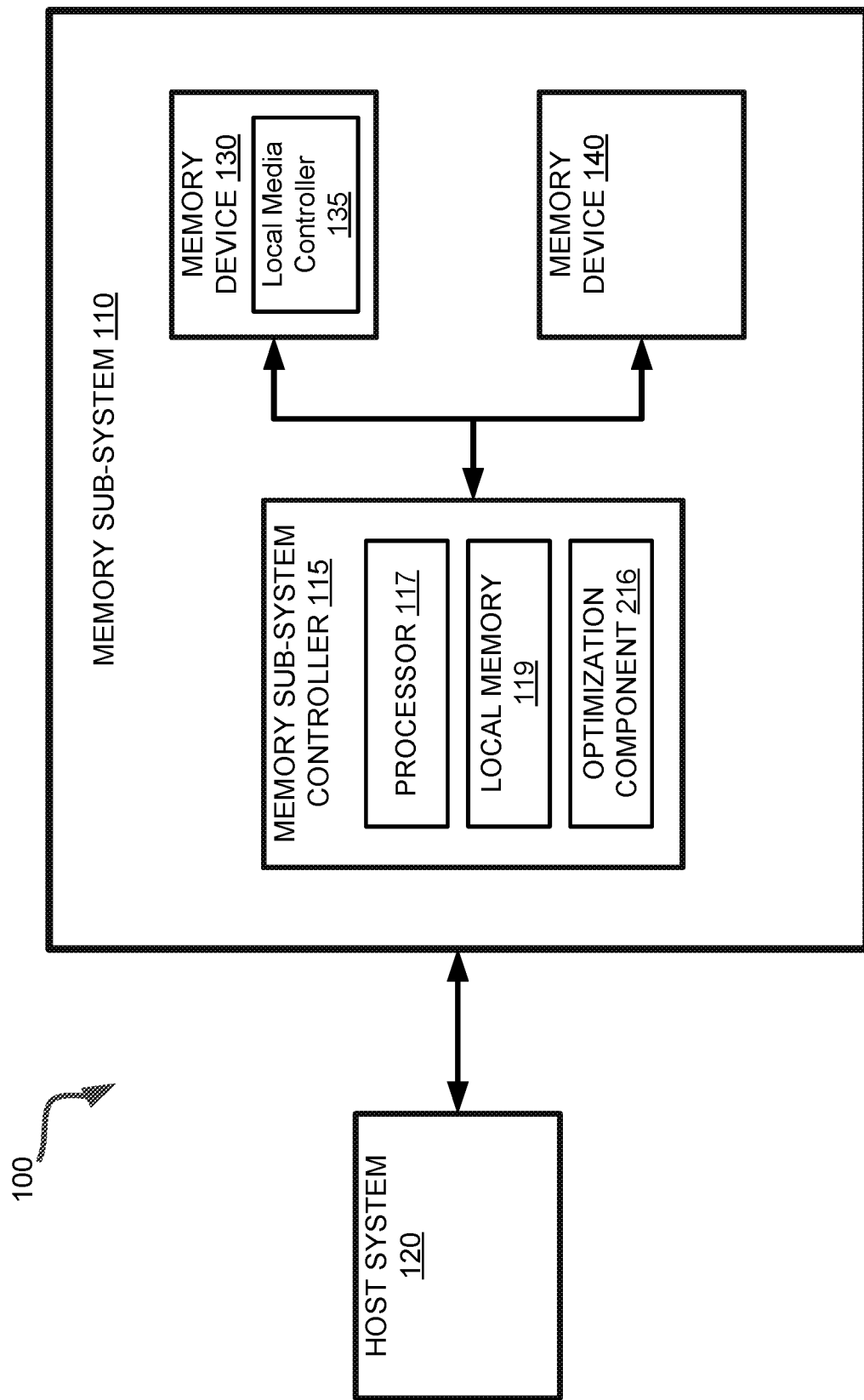
FIG. 1 illustrates an example computing system that includes a memory sub-system and a host system, in accordance with some embodiments of the present disclosure.

Aspects of the present disclosure are directed to enabling a memory sub-system to handle memory device degradation. The memory sub-system can be a storage device, a memory module, or a combination of a storage device and memory module. Examples of storage devices and memory modules are described below in conjunction with FIG. 1. In general, a host system can utilize a memory sub-system that includes one or more memory devices to store data. The host system can provide data to be stored by the memory devices of the memory sub-system and can request data to be retrieved from the memory devices of the memory sub-system.

The memory devices that store the data can degrade over time. The degradation can be caused by a variety of reasons, such as, transistor aging. Transistor aging can also be referred to as silicon aging and can occur when transistors develop flaws over time as they are used. The flaws degrade the performance and reliability of the memory devices and can cause read errors, write errors, other errors, or a combination thereof. Some read and write errors can be corrected using error correction codes but eventually the degradation becomes more severe and causes the memory devices to fail and become unusable.

Memory sub-systems can perform physical interface training (e.g., PHY training) to reduce read and write errors. The training can be performed with the assistance of tools and occurs before the memory sub-system is provided to the end consumer. The training is specific to each assembled memory sub-system and involves updating the settings of the memory controller to optimize performance of the final end product. The training often involves experimenting with different values for the memory controller settings and selecting the values that provide the best performance. The conventional memory controller settings used during training relate to signal strobe delay (e.g., DQS) and reference voltage (Vref) and are often not enough to compensate for the degradation of the memory devices.

Aspects of the present disclosure address the above and other deficiencies by having a memory sub-system that can better compensate for memory device degradation. The memory sub-system can include settings that enable the memory controller to change the shapes of periodic signals generated by the memory controller (e.g., write strobe signal) and the shapes of periodic signals generated by the memory device (e.g., read strobe signal). The settings discussed above can be specific to the memory controller and enable the memory controller to change how periodic signals are logically interpreted (e.g., Vref) or to delay the periodic signals (e.g., phase shift). The technology disclosed herein can expose settings internal to the memory device to enable the memory controller to modify the shape of signals that are internal to a memory device. In one example, the settings can change the shape of a signal received by the memory device or generated by the memory device by changing the duty cycle of the signal. The duty cycle is a property of a signal and can indicate the relationship between durations of the signal that are high and durations of the signal that are low (e.g., ratio between active and inactive portions of the signal).

The technology disclosed herein enables a memory controller to identify optimum values for settings that are internal to a memory device. The optimum values can be used to monitor degradation caused by transistor aging or to update the configuration of the memory sub-system to compensate for the degradation. The memory controller can identify an optimum value by testing different values and selecting a value that minimizes data access errors. The data access errors can be based on read errors, write errors, other errors, or a combination thereof. The technology disclosed can also enable the memory controller to use the optimum values to measure and respond to the degradation of a memory device. Changes to the optimum value of a particular setting can enable the memory controller to detect an increase in degradation and can be used to measure the increase in degradation or the increase in the rate of degradation. In one example, multiple optimum values for the same setting can be used to calculate a degradation measurement. The multiple optimum values can be for the same memory device (e.g., historical values) or for different memory devices (peer device values). The degradation measurement can be compared to one or more threshold values to determine an action to perform. The action can be a notification that indicates to a host system that degradation of a memory device has been detected (e.g., informational, warning, or error message). The action can also or alternatively involve changing the configuration of the memory sub-system to reduce the rate of degradation (e.g., reconfiguring the memory controller clock signal).

Advantages of the technology disclosed herein include, but are not limited to, enhancing the performance, reliability, lifetime, and failure avoidance of memory sub-systems. The technology can enable a memory sub-system to enhance its performance and reliability by enabling a memory controller to identify optimum values that compensate for the degradation of one or more memory devices. The technology can also or alternatively increase the lifetime of the memory sub-system by detecting degradation of the memory devices and reconfiguring the memory devices to reduce the degradation over the lifetime of the memory device. The technology can also enable the memory sub-system to avoid system failure by providing notifications before the memory device fails. The notifications can indicate the current or future degradation state (e.g., heath status) of the memory sub-system.

FIG. 1 illustrates an example computing system 100 that includes a memory sub-system 110 and a host system 120 in accordance with some embodiments of the present disclosure. The memory sub-system 110 can include media, such as one or more non-volatile memory devices (e.g., memory device 130), one or more volatile memory devices (e.g., memory device 140), or a combination of such. Each memory device 130 or 140 can be one or more memory component(s).

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components or devices, which can be an indirect communicative connection or direct communicative connection (e.g., without intervening components or devices), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface, which can communicate over a system bus. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for memory management within the same memory device package. An example of a managed memory device is a managed NAND (MNAND) device.

The memory sub-system 110 can include an optimization component 216 that optimizes the configuration of the memory sub-system 110 to account for the degradation of one or more memory devices 130, 140. Optimization component 216 can detect the degradation of a memory device and modify settings of the memory device to minimize the effects of the degradation. Memory sub-system 110 can use the output of the optimization component 216 to reconfigure the memory sub-system to reduce the degradation or the rate of degradation. These and other features of optimization component 216 are discussed below.

Figure 2:
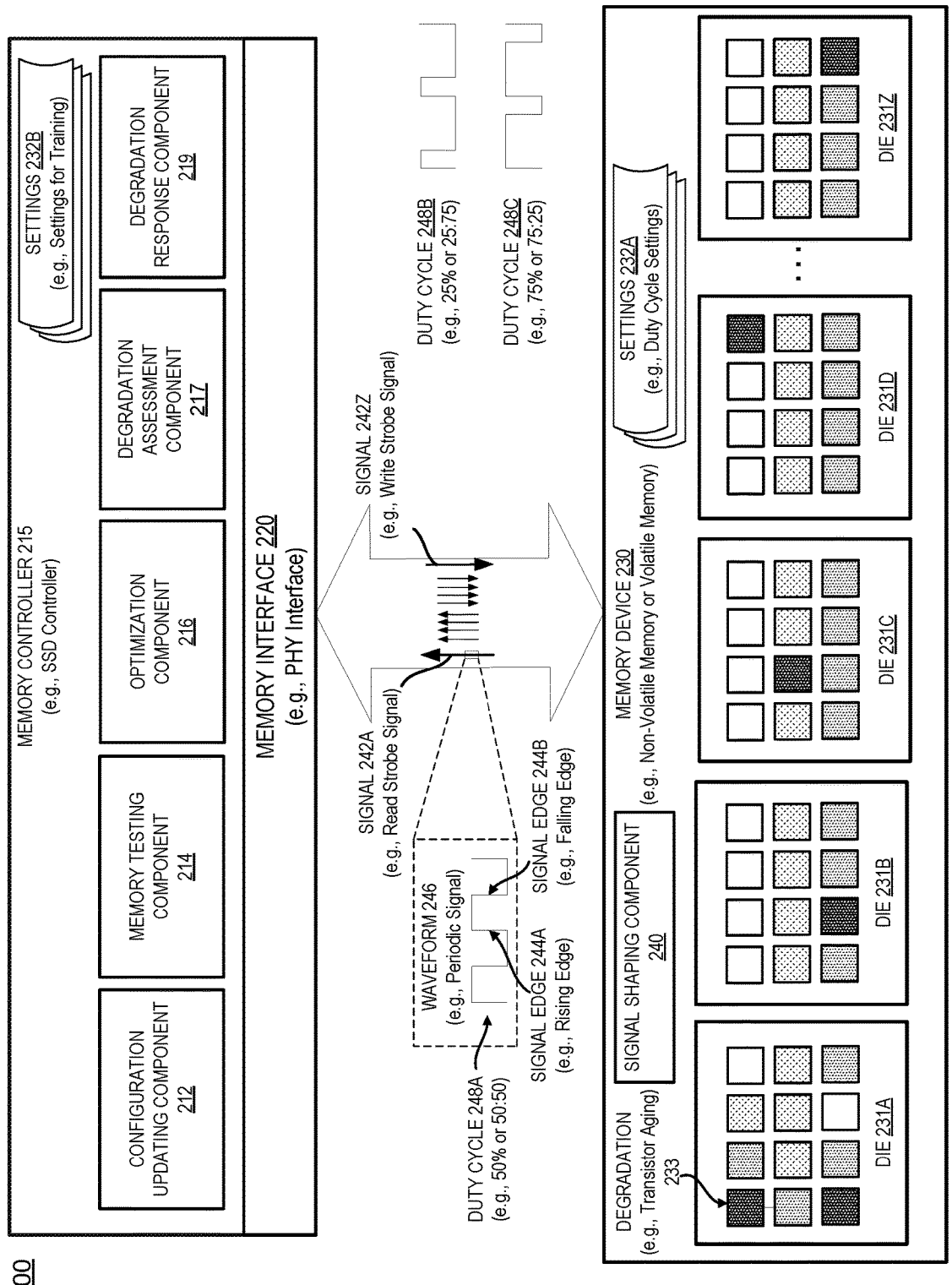
FIG. 2 is a detailed block diagram of the memory sub-system in accordance with some embodiments of the present disclosure.

FIG. 2 is a detailed block diagram of a memory controller and memory devices of FIG. 1. In the example shown, memory controller 215 and memory device 230 include settings 232A-B and generate or modify signals 242A-Z. Memory controller 215 and memory device 230 can be the same or similar to the respective memory sub-system controller 115 and memory device 130 of FIG. 1. In one example, the memory controller 215 can be packaged with the memory devices (e.g., SSD drive). In another example, memory controller 215 can be packaged separately from memory devices 230 and be integrated with or a part of a host system's central processing unit (CPU), system on a chip (SOC), other processor, or a combination thereof. Memory controller 215 can update settings 232A-B to modify a configuration of memory sub-system 110. The configuration of memory sub-system 110 can be based on the configuration of memory device 230 (e.g., settings 232A), the configuration of memory controller 215 (e.g., settings 232B), or a combination thereof.

Memory device 230 can include high density non-volatile memory devices where retention of data is desired when no power is supplied to the memory device. One example of non-volatile memory devices is a negative-and (NAND)

memory device. Other examples of non-volatile memory devices are described above in conjunction with FIG. 1. A non-volatile memory device can be a package of one or more dies 231A-Z. Each of dies 231A-Z can consist of one or more planes and for some types of non-volatile memory devices (e.g., NAND devices), each plane consists of a set of physical blocks. Each block consists of a set of pages and each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. Memory device 230 and the memory cells can degrade as represented by degradation 233.

Degradation 233 represents degradations of a memory device 230 that occur from use and can change the properties of electronic components. The degradations can be caused by flaws that develop over time that adversely affect the operation of memory device 230. Degradation 233 can affect any portion of a memory device and can degrade a device's performance, reliability, operation, function, characteristics, other property, or a combination thereof. Degradation can affect transistors, diodes, capacitors, resistors, magnetic devices, gates, connectors, integrated circuits, optoelectronic devices, quantum devices, other devices, or a combination thereof. Degradation 233 can be the same or similar to transistor aging and can cause a transistor (e.g., silicon transistor) to develop flaws over time that alter the electrical properties and function of the transistor. The transistor can be made of silicon (e.g., silicon transistor) or other material and can be a Field Effect Transistor (e.g., metal-oxide semiconductor field-effect transistor (MOSFET)), a bipolar junction transistor, or other transistor. Degradation 233 that is based on transistor aging can be caused by bias temperature instability, electromigration, charge trapping, other cause, or a combination thereof.

Bias temperature instability (BTI) can cause an increase in a threshold voltage and consequent decrease in drain current and transconductance of a transistor. Bias temperature instability can occur because charges can become trapped over time at the oxide-semiconductor boundary underneath the transistor gate. The charges can affect (e.g., partially cancel) the gate voltage without contributing to conduction through the channel as electron holes in the semiconductor as expected. When the gate voltage is removed, the trapped charges dissipate over a time scale of milliseconds to hours. As transistors decrease in size there is less averaging of the effect over a large gate area. Thus, different transistors experience different amounts of BTI, defeating standard circuit design techniques for tolerating manufacturing variability which depend on the close matching of adjacent transistors. Bias temperature instability can include negative BTI (NBTI), positive BTI (PBTI), or a combination thereof and can affect p-channel MOS transistors (pMOS), n-channel MOS transistors (nMOS), or a combination thereof.

Bias temperature instability (e.g., NBTI) can adversely affect power-saving techniques, such as reduced operating voltages and clock gating. The lower operating voltages causes BTI-induced threshold voltage change to be a larger fraction of the logic voltage and can disrupt operations. When a clock is gated off, transistors stop switching and BTI effects accumulate more rapidly. When the clock is re-enabled, the transistor thresholds have changed and the circuit may not operate. As discussed below in regards to degradation response component 219, the memory subsystem can be reconfigured to use a low-frequency clock signal rather than stopping the clock signal completely to mitigate BTI effects (e.g., reduce the degradation rate). BTI and other forms of degradation 233 can adversely affect the memory device 230, which can use a signal shaping component 240 to minimize the effects of degradation 233.

Signal shaping component 240 can generate or modify the shape of a signal and one or more pulses of the signal. Signal shaping component 240 can include hardware (e.g., circuitry), software (e.g., firmware), other logic, or a combination thereof. In the example illustrated in FIG. 2, signal shaping component 240 can be included in (e.g., integrated with) memory device 230 as part of local media controller 135, dies 231A-Z, other portion of memory device 230, or a combination thereof. In another example, signal shaping component 240 can also or alternatively be included in memory controller 215 or other portion of memory subsystem 110. In either example, signal shaping component 240 can shape one or more signals 242A-Z.

Signals 242A-Z can be used by memory controller 215 and memory device 230 to synchronize, manipulate, or transmit data. The data can include command data (e.g., commands, operations), location data (e.g., storage address), external data (e.g., user data), internal data (e.g., parity data, mapping data), other data, or a combination thereof. Signals 242A-Z can include query signals (e.g., DQ), timing signals (e.g., clock signals (CLK), strobe signals (RdDQS, WrDQS), location signals (e.g., address signal), and other signals. Each of signals 242A-Z can be an analog signal (e.g., continuous signal) or digital signal (e.g., quantized signal) and can be based on a time varying voltage, current, magnetic field, electromagnetic wave, or a combination thereof. The signal can include one or more signal pulses. Each of the signal pulses is a rapid and transient change in the amplitude of the signal from a baseline value to a higher or lower value followed by a rapid return to the baseline value. The pulse can have a particular shape and be the same or similar to a rectangular pulse, raised cosine pulse, gaussian pulse, dirac pulse, sinc pulse, nyquist pulse, other pulse, or a combination thereof. The pulse of a signal can have one or more signal edges 244A-B.

Signal edges 244A-B can be the transition of a digital signal or analog signal from low to high or high to low. Each pulse includes two edges and each signal can include multiple pulses. Signal edge 244A is the low-to-high transition and can be referred to as a rising edge, positive edge, leading edge, front edge, or other term. Signal edge 244B is the high-to-low transition and can be referred to as a falling edge, negative edge, trailing edge, or back edge. A signal and its multiple edges can be represented as a waveform 246.

Waveform 246 is the shape of a signal when graphed as a function of time (e.g., digital timing diagram). Waveform 246 can be a periodic waveform that is the same or similar to a sine wave, square wave, triangle wave, sawtooth wave, other wave, or a combination thereof. A signal with a periodic waveform can be referred to as a periodic signal and can be described or defined based on its signal properties. The signal properties can include amplitudes (e.g., pulse height), widths (e.g., pulse width), periods (e.g., wavelengths), phases, other properties, or a combination thereof. The signal properties can be based on one or more measurements or a combination of measurements as seen by duty cycles 248A-C.

Duty cycles 248A-C include three different examples of a duty cycle, which is a property of a signal and indicates the relationship between durations of the signal that are high and durations of the signal that are low. A digital signal can be considered high when it is active, on, or at a logical one and can be considered low when it is inactive, off, or at a logical zero. An analog signal can be considered high if it has a signal property (e.g., voltage, current) that is equal to or greater than a predetermined threshold value (e.g., reference voltage (Vref)) and is considered low when it is less than the threshold value.

In the examples shown in FIG. 2, memory device 230 can modify duty cycle 248A of signal 242A using settings 232A and signal shaping component 240. In one example, settings 232A can change the duty cycle of signal 242A without changing the phase (e.g., no phase shift or signal delay) by changing the rising signal edge 244A or falling signal edge 244B. In another example, settings 232A can change the phase with or without changing the duty cycle by changing rising signal edge 244A and falling signal edge 244B. In either example, changing a signal edge can involve changing a slope of the edge (e.g., making edge steeper), a position of the edge (e.g., delaying edge), other aspect of the edge, or a combination thereof.

Settings 232A can be accessible to memory controller 215 or memory interface 220 and repeatedly updated to change the duty cycle multiple times. Each of the resulting duty cycles can be tested to evaluate how the memory sub-system performs when using the particular duty cycle. For example, a first value of a setting can cause the signal shaping component 240 of memory device 230 to change the duty cycle of signal 242A from duty cycle 248A (e.g., 50%) to duty cycle 248B (e.g., 25%). A second value of the setting can cause the signal shaping component 240 to change signal 242A from duty cycle 248B to duty cycle 248C (e.g., 75%). This process is discussed in more detail in regards to FIG. 3 and can be initiated, monitored, and evaluated by memory controller 215.

Figure 3:
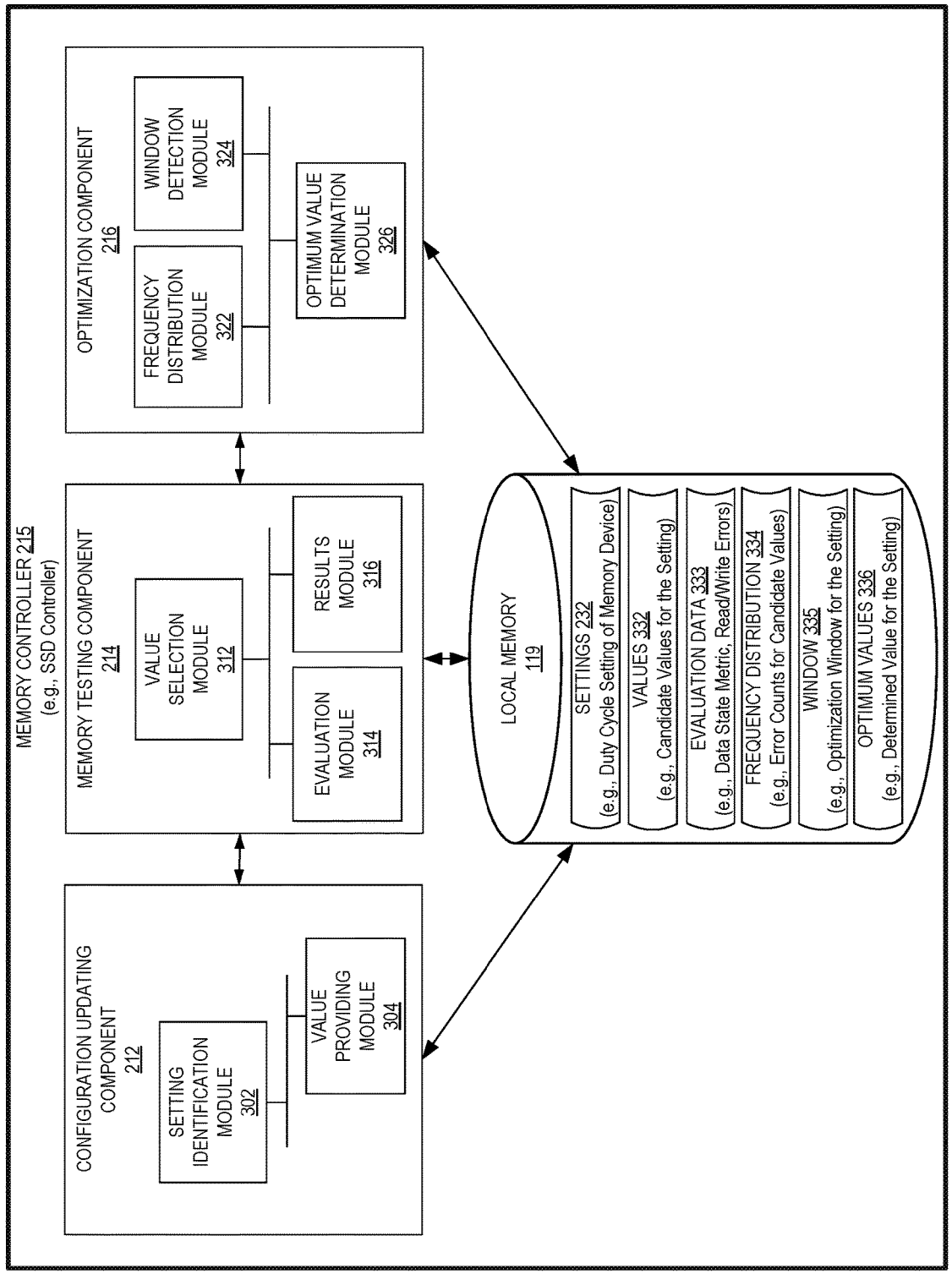
FIG. 3 is a detailed block diagram of the memory controller of FIG. 2, in accordance with some embodiments of the present disclosure.

FIG. 3 is a block diagram illustrating an exemplary memory controller 215 that includes technology to detect degradation of a memory device and identify optimum settings to compensate for the degradation, in accordance with some embodiments of the present disclosure. In one example, memory controller 215 can use the technology to monitor the degradation and apply the optimum settings to reconfigure the memory devices and enhance the functionality of the memory devices. In another example, memory controller 215 can use the technology to monitor the degradation of memory devices and store changes to the optimum value without applying the optimum value to the memory device. This latter example can be used to measure the degradation as discussed in more detail in regards to FIG. 5.

The features discussed in regards to the components and modules of FIG. 3 can be implemented in software (e.g., computer code) or hardware (e.g., circuitry) of memory sub-system 110. More or less components or modules can be included without loss of generality. For example, two or more of the components can be combined into a single component, or features of a component can be divided into two or more components. In the example illustrated, memory controller 215 can include a configuration updating component 212, a memory testing component 214, and an optimization component 216.

Configuration updating component 212 enables memory controller 215 to update the configuration of memory sub-system 110 by changing settings that control how the signals are used to read and write data. In one example, configuration updating component 212 can include a setting identification module 302 and a value providing module 304.

Setting identification module 302 can enable memory controller 215 to identify one or more settings 232 of the memory sub-system that can be used to optimize the operation of the memory sub-system. Settings 232 can include settings that affect or control the operation of one or more memory devices (e.g., settings 232A), memory controllers (settings 232B), host systems, other computing device, or a combination thereof. Setting identification module 302 can identify a set of one or more settings 232 that can be updated by memory controller 215 to optimize the operation of memory sub-system by changing the shape of one or more signals.

Settings 232 can change a duty cycle of the signal internal to the memory device by changing a timing setting. The timing setting (e.g., timing parameter, timing configuration) can cause the memory device to change the duty cycle of the signal with or without changing a phase of the signal. The timing setting can affect the rising edge, falling edge, or a combination thereof. The timing setting can cause an effect by changing an electrical property of the memory device that creates, adjusts, or propagates the signal. The electrical property can affect the loading rate, unloading rate, charge rate, discharge rate, capacitance, impedance, conductance, current, voltage, resistance, other electrical or electromagnetic property, or a combination thereof. Settings 232 can change the rate a circuit charges/loads to affect a rising edge and can change the rate the circuit discharges/unloads to affect the falling edge. Causing the circuit to charge faster or discharge slower causes the pulse to be in a high state (e.g., above Vref) for a longer duration of time (i.e., higher duty cycle). Conversely, causing the circuit to charge slower or discharge faster causes the pulse to be in a high state for a shorter duration of time (i.e., lower duty cycle). In one example, settings 232 can include a single setting that controls the duty cycle of a particular signal. In another example, settings 232 can include a set of settings to control the duty cycle of a particular signal and one of the settings can control a rising edge (e.g., charging rate) of the signal and a second setting can control a falling edge of the signal (e.g., discharging rate).

Value providing module 304 enables memory controller 215 to provide a value to the memory device to update the identified setting. The value can be a signal representing one or more bits of information (e.g., 8 bit, 32 bit, 64 bit) and can be a binary value (e.g., true/false, on/off, active/inactive), a numeric value (e.g., 0-7, 0-63, 0-255), other value, or a combination thereof. The value can be selected by memory controller 215, as discussed below, and can be stored by memory controller 215, one or more memory devices 230, or a combination thereof. In one example, memory controller 215 can provide the value to the memory device by transmitting (e.g., sending) the value to the memory device. In another example, memory controller 215 can provide the value to the memory device by storing the value at a storage location that is accessible to the memory device. The storage location can be in persistent or non-persistent storage and be a processor register, mode register, or other location in memory controller 215, memory device, or other portion of the memory sub-system.

Memory testing component 214 enables memory controller 215 to test different configurations of the memory devices. Testing the different configurations can involve selecting values and evaluating the use of each of the values for the one or more settings 232. Testing can be the same or similar to training, customizing, or calibrating the memory sub-system. In one example, testing the different configurations of the memory device is separate from physical interface training (e.g., PHY training), which tests different configurations of the memory controller 215 and memory interface 220. In another example, testing the different configurations of the memory device is a part of the physical interface training and can be done before, during, or after the parameters for the physical memory interface are optimized. In the example illustrated in FIG. 3, memory testing component 214 can include a value selection module 312, an evaluation module 314, and a results module 316.

Value selection module 312 enables memory controller 215 to select a set of values for a setting of a memory device. The set can be referred to as candidate set and can include candidate values that will be tested. The set can include many different values that each result in a different configuration of at least one memory device and therefor a different configuration of the memory sub-system. For example, a first value can result in a first configuration that causes the duty cycle of a signal to be below 50% (e.g., 40% duty cycle for read strobe signal) and the second value can result in a second configuration that causes the duty cycle of the signal to be above 50% (e.g., 60% duty cycle for read strobe signal). The set can include one or more values that are selected at a time of design, manufacturing, installation, initialization, runtime, test time, other time, or a combination thereof. In one example, all of the values in a set can be selected before the testing of the set begins. In another example, one or more of the values in the set are selected after a prior value in the set is tested. The latter example can enable values to be selected based on feedback from another value in the set. In either example, values in the set can be applied to update the setting and evaluated using evaluation module 314.

Evaluation module 314 enables memory controller 215 to evaluate the effects of each of the values in the set on the operation of the memory sub-system. Evaluating the memory sub-system can involve evaluating access to data on the memory device by performing one or more operations while the value for the setting is in use and tracking the errors. The data that is used for testing and evaluation can be referred to as test data and can be data provided by a host system (e.g., mission data, user data) or can be test data that is provided by memory controller 215 (e.g., dedicated test data). The dedicated test data can be a specific pattern or sequence of bits that is generated by memory controller 215 and used for the testing and evaluation of settings (e.g., sample data, Gray code; Reflected Binary Code (RBC)).

In one example, evaluation module 314 can determine data state metrics for the memory sub-system. A data state metric can refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

Memory controller 215 can evaluate the use of a value for a setting by determining a data state metric that is based on errors (e.g., read errors, write errors, or a combination). Memory controller 215 can detect the errors by comparing the actual results of operations with the expected results of the operations. The operations can be data access operations that include one or more reads, writes, additions, removals, loads, unloads, insertions, deletions, erases, moves, copies, encryption, compression, transmit, send, receive, other operation, or a combination thereof. Evaluation module 314 can write data to a memory device, read data from the memory device, and compare data. Evaluation module 314 can detect an error by directly comparing the written data with the read data or by performing a comparison based on redundancy data (e.g., XOR parity data). In one example, detecting an error can be performed in the absence of error correction and any difference detected by the comparison can be considered an error. In another example, the comparison can be performed after using error correction to correct minor errors (e.g., single bit errors) and the more substantial errors can be considered as errors.

Results module 316 enables memory controller 215 to access the results of evaluation module 314 and store the results in local memory 119 as evaluation data 333. The results of the evaluation can be referred to as evaluation results, testing results, training results, error data, or other term. Evaluation data 333 can be based on the errors that occur during the operation of the memory sub-system and can include or be associated with data describing the settings 232, values 332, other configuration information, or a combination thereof. Results module 316 can access (e.g., receive, read, listen, handle) error data that indicates the errors that occur when using the different values of a setting. Results module 316 can store the error data as-is or can perform operations on the error data to aggregate, modify, supplement, filter, redact, replace, or modify the data before, during, or after the evaluation data 333 is stored in local memory 119.

Optimization component 216 enables memory controller 215 to analyze the output of memory testing component 214 and determine values for settings 232 that optimize memory devices that have degraded. Optimization component 216 can determine an optimum value by analyzing the errors and identifying a range of values that resulted in the least amount of errors and selecting a value within the range (e.g., middle value of window). In one example, optimization component 216 can include a frequency distribution module 322, a window identification module 324, and an optimum value determination module 326.

Frequency distribution module 322 enables memory controller 215 to determine one or more frequency distributions 334 that represent the results of the tested values. Frequency distribution 334 can be or include one or more data structures (e.g., array, list, table, matrix) that indicate the frequency of errors relative to one or more values, settings, or configurations. The errors can correspond to read errors, write errors, read and write errors, training errors, other errors, or a combination thereof. The frequency of the errors (e.g., error frequencies) can be represented and stored as one or more sums, ratios, percentages, probabilities, means, medians, modes, deviations, dispersions, variance, other numeric or statistical value, or a combination thereof. Each error frequency can correspond to a particular bin or bucket for a particular value or a range of values of one or more settings. In one example, memory controller 215 can generate a frequency distribution 334 for each die of a memory device, for each memory device, for each memory controller, other granularity, or a combination thereof.

Frequency distribution 334 can be a univariate distribution (e.g., single variable) or multivariate distribution (e.g., two or more variables) and can correspond to one or more dimensions. In one example, the frequency distribution can represent the quantities of errors relative to a single setting that affects the duty cycle of a signal (e.g., single dimension). In another example, the frequency distribution can represent the quantities of errors relative to multiple settings (e.g. multiple dimensions). A first setting can correspond to a setting that affects the rising signal edge (e.g., charging rate) and a second setting can correspond to a setting that affects the falling signal edge (e.g., discharging rate). In other examples, the univariate or multivariate distribution can be based on variables that affect a duty cycle, phase shift, timing delay, rising edge, falling edge, period, pulse width, amplitude, frequency, reference voltage, other value, or a combination thereof.

Window identification module 324 enables memory controller 215 to analyze frequency distribution 334 and identify a window 335 in the frequency distribution 334 that corresponds to lower error frequencies (e.g., error frequency of 0). As discussed above, frequency distribution 334 can represent the frequency of data access errors relative to duty cycle. This can be mathematically represented as the error count as a function of duty cycle skew. The duty cycle skew can correspond to a value (e.g., offset value, skew value) that is relative to a 50/50 balanced duty cycle and can include positive and negative values. In a simplified example, frequency distribution 334 can indicate 500 errors at −10 skew (40/60 duty cycle), 0 errors at −5 skew (e.g., 45/55 duty cycle), 0 errors at 0 (50/50 duty cycle), 0 errors at +2 skew (52/48 duty cycle), 500 errors at +5 skew (55/45 duty cycle), and 1000 errors at +10 skew (60/40 duty cycle). Window identification module 324 can analyze frequency distribution 334 to identify that there is a window (e.g., window 335) that has little to no errors between values −5 and +2 (45%-52% duty cycle).

Optimum value determination module 326 enables memory controller 215 to determine one or more optimum values 336. Optimum values 336 can be any value that is selected by memory controller 215 and is better than at least one other value for the setting (e.g., better than a candidate value). An optimum value can be a global optimum value, a local optimum value, a sub optimum value, other value, or a combination thereof. The optimum value can be the best value, second from the best value (e.g., next best), second from the worst value, or any value between the best and worst values. In one example, determination of the optimum value can be performed with or without determining window 335. The technology for determining the optimum values is discussed in more detail below, in regards to FIG. 4.

Figure 4:
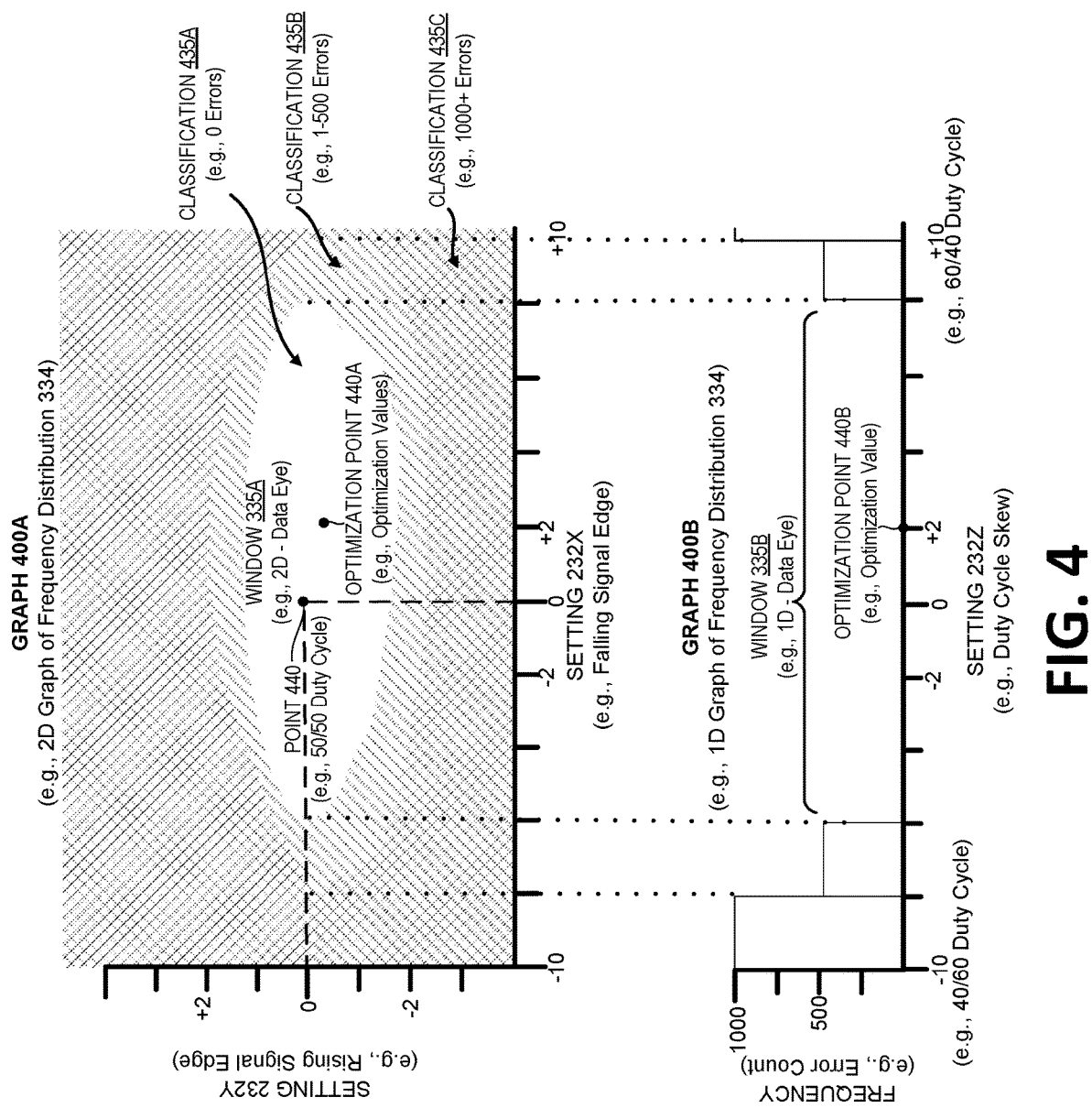
FIG. 4 is a diagram that illustrates how a memory controller can analyze a frequency distribution to determine setting values that optimize the memory sub-system, in accordance with some embodiments of the present disclosure.

FIG. 4 illustrates example graphs that demonstrate how memory controller can use window identification module 324 and optimum value determination module 326 to analyze frequency distribution 334 and determine one or more optimum values for settings of the memory sub-system. In the example illustrated, FIG. 4 includes graphs 400A-B, classifications 435A-C, windows 335A-B, and optimization points 440A-B.

Graphs 400A-B can be graphical representations of frequency distribution 334. Graph 400A can be a two dimensional graph of frequency distribution 334 and graph 400B can be a one dimensional graph of frequency distribution 334 (e.g., histogram). Graph 400A can be the same or similar to a heat map histogram that combines features of a histogram with features of a heat map. Graph 400A uses different patterns to indicate the frequency magnitudes at different points in the coordinate space. In other examples, graphs 400A-B can have a coordinate space with different number of dimensions (e.g., one dimensional (1D), two dimensional (2D), three dimensional (3D), or n-dimensional).

Each point in graphs 400A-B can correspond to one or more setting values and represent a particular configuration of memory sub-system. Each point on one dimensional graph 400B (e.g., optimization point 440B) can correspond to a value for setting 232Z (e.g., duty cycle skew). Each point on two dimensional graph 400A (e.g., optimization point 440A) can correspond to two values, one for each of two different settings. The first value can be a coordinate along a dimension representing setting 232X (e.g., falling signal edge skew) and the second value can be a coordinate along a dimension representing a second setting 232Y (e.g., rising signal edge skew). As shown in graph 400A, memory controller 215 can classify each point into one or more classifications 435A-Z based on the magnitude of its frequency (e.g., error count).

Each of classifications 435A-C are displayed as a region of graph 400A and includes points with similar frequencies (e.g., error counts within a predefined range). In the example shown, classification 435A indicates a region with points having smaller frequency magnitudes (e.g., error frequency of 0), classification 435B indicates a region with points having a medium frequency magnitudes (e.g., error frequencies between 0 and threshold value 7), and classification 435C indicates a region with points having larger frequency magnitudes (e.g., error frequencies larger than or equal to the threshold value 7). Each of classifications 435A-C are illustrated as a continuous region but in other examples each classification can be discrete with multiple separate regions. Memory controller 215 can designate the classification with the smallest frequency magnitudes to be window 335A.

Windows 335A-B can be referred to as optimization windows or minimization windows and each window can represent the configurations of the memory sub-system that minimize errors. Windows 335A-B can correspond to one or more ranges of values for one or more settings. For example, window 335B could be one dimensional and correspond to a single range values for setting 232Z (e.g., −6.0 to +8.0 duty cycle skew). Window 335A can be a two dimensional area and correspond to two ranges of values. Each of the two ranges can correspond to a different setting (e.g., −6.0 to 8.0 range for setting 232X, −2.0 to 1.0 range for setting 232Y). As illustrated in graph 400A, window 335A can have the appearance of an eye and can be referred to as a data eye and be related to a signal's eye pattern or eye diagram provided by an oscilloscope. Settings 232X-Z can be any setting of a memory sub-system such as a setting internal to one or more memory devices, memory interface, memory controller, or a combination thereof as discussed above in regards to settings 232 of FIG. 3 (e.g., duty cycle, rising edge skew, falling edge skew). Memory controller 215 can use window 335A to determine optimization point 440A or use window 335B to determine optimization point 440B.

Optimization points 440A-B each represent a configuration of the memory sub-system that best accommodates existing degradation of the memory device (e.g., offsets or accounts for the degraded state). An optimization point can be the same or similar to a middle point, center point, maximum point, minimum point, or a combination thereof. An optimization point can be referred to as an optimum point or optimal point and includes one or more optimum values 336 (e.g., optimum X value and Y value). Memory controller 215 can determine the optimization point based on the optimization window by identifying a point that has the largest distance from the boundary of the optimization window. The boundary of the window corresponds to configurations that have increased errors and the optimization point corresponds to the configuration that is farthest from these configurations and therefore provides the largest margin for error. The boundary of windows 335A-B can include many points and include at least one lower boundary point and upper boundary point for each dimension.

Memory controller 215 can determine the optimization point that is farthest from the boundary using one or more different algorithms. In one example, memory controller 215 can select a middle point (e.g., center point) between the lower and upper boundary for each of the one or more dimensions. Memory controller 215 can identify the lower and upper boundary points along each dimension by comparing point values (e.g., X, Y, or Z coordinate values) on the window boundary to identify the point with the lowest value and the point with the highest value (e.g., lowest and highest X coordinates). Memory controller 215 can determine a point in the middle of the upper and lower boundaries for each of the dimensions. In other examples, memory controller can determine the optimization point by selecting the point that is the farthest from some or all of the boundary points by analyzing points within the window (e.g., random selected points) and calculating the distance to one or more of the boundary points and selecting the point with the largest value (e.g., least mean square analysis).

Figure 5:
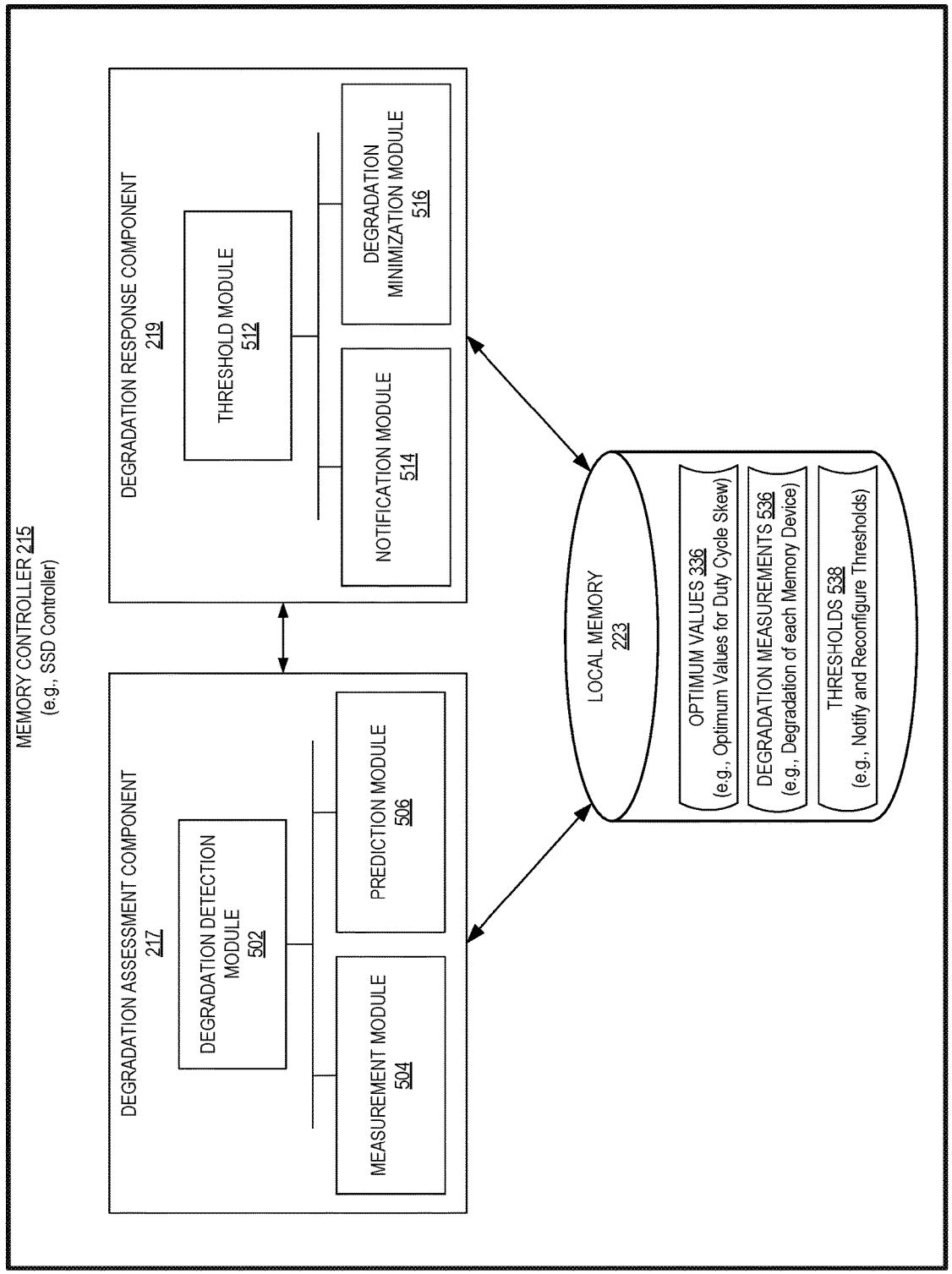
FIG. 5 is a detailed block diagram of the memory controller of FIG. 2, in accordance with some embodiments of the present disclosure.

FIG. 5 is a block diagram illustrating an exemplary memory controller 215 that that can use the optimum values identified above to measure the degradation of the memory device and can respond accordingly. The response can involve notifying a host system, reconfiguring the memory sub-system, or a combination thereof. The features discussed in regards to the components and modules of FIG. 5 can be implemented in software (e.g., program code) or hardware (e.g., circuitry) of memory controller 215. More or less components or modules can be included without loss of generality. For example, two or more of the components can be combined into a single component, or features of a component can be divided into two or more components. In the example illustrated, memory controller 215 can include a degradation assessment component 217 and a degradation response component 219.

Degradation assessment component 217 can enable memory controller 215 to detect and measure the degradation of one or more memory devices of a memory sub-system. In one example, degradation assessment component 217 can include a degradation detection module 502, a measurement module 504, and a prediction module 506.

Degradation detection module 502 can enable memory controller 215 to detect whether a memory device has degraded. As discussed above in regards to degradation 233, the memory device degradations can include permanent degradations, temporary degradations, or a combination thereof. Degradation detection module 502 can detect the degradation based on one or more of the values discussed above (e.g., optimum value, lower boundary value, upper boundary value) by performing one or more operations that include comparisons, calculations, or other operations. For example, degradation detection module 502 can compare a value of a setting to other values for the same setting or a different setting. In one example, degradation detection module 502 can compare values of multiple optimization points and can compare one or more recent optimization points with one or more prior optimization points (e.g., detect that the point moved up, down, left, right, or stayed in the same location). In another example, degradation detection module 502 can compare values of multiple optimization windows and can compare one or more recent optimization windows with one or more prior optimization windows (e.g., detect that the window is larger, smaller, shifted, or stayed the same).

Measurement module 504 enables memory controller 215 to determine degradation measurements 536 for one or more memory devices of a memory sub-system. The degradation measurement can quantify the degradation and indicate the amount of degradation a memory device has experienced. The degradation measurement can be referred to as a health measurement, reliability measurement, performance measurement, status measurement, other term, or a combination thereof. The degradation measurement can be an absolute value that is calculated in view of a baseline value that is absent degradation or can be a relative value that is calculated in view of a prior degradation measurement (e.g., delta value). The degradation measurement can be determined based on another value of the same memory device, a different memory device (e.g., same or different memory sub-system), an average memory device (e.g., typical memory device), a theoretical memory device (e.g., ideal or perfect memory device), other memory device, or a combination thereof. Each of degradation measurements 536 can include one or more values (e.g., degradation values). A value can be a numeric or non-numeric value and can be or include an integer value, decimal value, percentage value, probabilistic value, statistical value, character value, other value, or a combination thereof. In one example, measurement module 504 can calculate a degradation measurement each time an optimum value is determined.

Measurement module 504 can calculate the degradation measurement based on optimum values 336 and other values. Optimum values 336 could be based on an optimization point, optimization window, other value, or a combination thereof. For example, measurement module 504 can calculate the degradation measurement (DM) based on a recent optimum value (OPTrec), an initial optimum value (OPTinit), a maximum setting value (SETmax), other value, or a combination thereof. The recent optimum value (e.g., OPTrec) can be the most recent optimum value 336 (e.g., current optimum value) that was calculated based on the testing discussed above in regards to optimization component 216. The initial optimum value (e.g., OPTinit) can be a historical optimum value that was determined prior to the recent optimum value and can be determined at a time of manufacturing, design, installation, initialization, runtime, test time, other time, or a combination thereof. In one example, the initial optimum value can be a value determined during the manufacturing process using external tools (e.g., oscilloscope or other analysis tool) and applied prior to shipping the final product to an end consumer. The value can be permanently applied by modifying one or more hardware features (e.g., one or more fuses or circuits). The maximum setting value (e.g., SETmax) can be the based on the range of values for a setting. As discussed above, the setting of a memory device can adjust the duty cycle of a signal internal to the memory device (e.g., read strobe signal) and can accept values within a range that includes a minimum setting value (e.g., 1/100 or 1% duty cycle) and a maximum setting value (e.g., 99% or 99/100 duty cycle).

Measurement module 504 can calculate the degradation measurement (DM) based on one or more mathematical expressions (e.g., formulas, functions, equations). An example mathematical expression is included in the following equation: DM=[1−Absolute(OPTrec−OPTinit)/SETmax]*100. This equation can output the degradation measurement as a percentage value. A lower percentage value can indicate the memory device has less lifetime (e.g., higher degradation) and a higher percentage value can indicate the memory device has more lifetime (e.g., lower degradation). If the degradation measurement is close to 0% (can be negative), then the setting can no longer compensate for the degradation of the memory device and the memory device is at a high risk of failing. In other examples, the above equation can be modified to output a decimal value, integer value, ratio value, other value, or a combination thereof.

Prediction module 506 can enable memory controller 215 to predict a degradation measurement of one or more memory devices at a future point in time (e.g., future degradation state). The predicted degradation measurement can be based on one or more current or past degradation measurements 536. In one example, the predicted degradation measurement can be for a particular memory device and can be based on one or more historical degradation measurements of the particular memory device. In another example, the predicted degradation measurement can be for a particular memory device and can be based on one or more degradation measurements for other memory devices (e.g., other memory devices on the same SSD and/or controlled by the same memory controller 215). In other examples, it can be calculated based on other values or measurements or a combination thereof.

Degradation response component 219 can enable memory controller 215 to respond to a degradation of one or more memory devices of a memory sub-system. In one example, degradation response component 219 can include a threshold module 512, a notification module 514, and a degradation minimization module 516.

Threshold module 512 can enable memory controller 215 to analyze degradation measurements 536 in view of one or more thresholds 538 to trigger a response, to determine a degradation state, or a combination thereof. Thresholds 538 can define one or more boundaries between sets of degradation values (e.g., three sets of values). Each of the sets can correspond to a different response (e.g., action) or degradation state (e.g., low, medium, or high health). For example, a single threshold value can separate possible degradation measurements into a first set with values above the threshold value and a second set with values below the threshold value.

Thresholds 538 can correspond to one or more values that are compared with one or more degradation measurements 536. Thresholds 538 can include threshold values or can include one or more threshold functions for determining the threshold values. The threshold values can be or include predetermined values that are determined (e.g., calculated, identified, selected) at a time of design, manufacture, installation, or other time or can be determined by the threshold function before, during, or after execution of degradation response component 219. A threshold function can be a mathematical function (e.g., f(x), equation, expression, formula), program function (e.g., class method), other function, or a combination thereof. A threshold value can be a numeric or non-numeric value and can be or include an integer value, decimal value, percentage value, probabilistic value, statistical value, character value, other value, or a combination thereof. Thresholds 538 can be referred to as triggering thresholds, state thresholds, status thresholds, health thresholds, reliability thresholds, performance thresholds, or other term.

Threshold module 512 can perform one or more comparisons to determine if degradation measurements 536 satisfy one or more thresholds 538. Determining whether a threshold is satisfied or unsatisfied can involve determining whether the degradation measurement is above a threshold value, below a threshold value, equal to a threshold value, or a combination thereof. In one example, a threshold is satisfied when (e.g., in response to, if) the degradation measurement is equal to or above the threshold and is unsatisfied when the degradation measurement is below the threshold. In another example, a threshold is satisfied when (e.g., in response to, if) the degradation measurement is equal to or below the threshold and is unsatisfied when the degradation measurement is above the threshold.

In one example, there can be a set of threshold values that define a set of degradation states of a memory device (e.g., health states). A first threshold value can be 30% and when the degradation measurement is above 30% (e.g., DM>=30%) the memory device can be in a first degradation state (e.g., green state). The first degradation state can indicate that the degradation risk is very low and monitoring continues with no response (e.g., no action taken). A second threshold value can be 10% and when the degradation measurement is between 10% and 30% (e.g., 10%<=DM<30%) the memory device can be in a second degradation state (e.g., yellow state). The second degradation state can indicate that the degradation risk is medium. The memory controller can respond to the state change by increasing how often the testing occurs (e.g., evaluation interval set from once a month to once a week) and provide a notification (e.g., informational message). A third threshold value can be 1% and when the degradation measurement is between 1% and 10% (e.g., 1%<=DM<10%) the memory device can be in a third degradation state (e.g., orange state). The third degradation state can indicate that the degradation risk is high. The memory controller can respond to the state change by increasing how often the testing occurs (e.g., evaluation interval set from once a week to once an day) and there can be one or more responses provided (e.g., warning notification and potential reconfiguration). A fourth threshold value can be 0% and when the degradation measurement is between 0% and 1% (e.g., 0%<=DM<1%) the memory device can be in a fourth degradation state (e.g., red state). The fourth degradation state can indicate that the degradation risk is very high. The memory controller can respond to the change in state by increasing how often the testing occurs (e.g., evaluation interval set from once an day to once an hour) and there can be one or more responses provided (e.g., reconfiguration of CLK signal and notification to replace SSD).

Notification module 514 can enable memory controller 215 to notify a host system based on the degradation of the memory sub-system. Notification module 514 can generate a notification and provide the notification to the host system using one or more communication channels. The notification can be an indication that is based on the degradation measurement and can indicate a current, past, or future degradation measurement, degradation state, or other value of degradation. The notification can include notification data (e.g., indication data) that includes one or more bits of information (e.g., 8 bit, 32 bit, 64 bit) and can be a binary value (e.g., true/false, on/off, active/inactive), a numeric value (e.g., 0-7, 0-63, 0-255), other value, or a combination thereof. In one example, memory controller 215 can provide the notification to the host system by transmitting (e.g., sending) a message to the host system. In another example, memory controller 215 can provide the notification to the host system by storing the notification data at a storage location that is accessible to the host system. The storage location can be internal to the memory sub-system (e.g., local memory, memory device), external to the memory sub-system (e.g., host main memory), other location, or a combination thereof.

Degradation minimization module 516 can enable memory controller 215 to reconfigure the memory sub-system based on the degradation of the memory sub-system. The reconfiguration can reduce or eliminate the rate of the degradation, the total amount of degradation, other degradation value, or a combination thereof. Degradation minimization module 516 can determine (e.g., identify or select) a configuration and apply the configuration to any portion of the memory sub-system, host system, or a combination thereof. The configuration can be the same configuration discussed above and can include changes to settings that affect the memory controller, memory devices, other portion of memory controller, or a combination thereof. In one example, degradation minimization module 516 can respond to a degradation measurement satisfying a threshold by updating a configuration of the memory controller to change a timing signal or parameter. The timing signal can be a clock signal (e.g., CK, CLK) a strobe signal (e.g., DQS), other signal, or a combination thereof. In one example, degradation minimization module 516 can enable memory controller 215 to activate a feature that avoids the timing signal from stopping (e.g., "NOIOCKGATE"). Activating this feature can reduce degradation but cause the memory device to consume more power because the timing signal internal to the memory device will continuously toggle and no longer pause to reduce power consumption.

FIG. 6 is a flow chart of a method 600 for optimizing a memory sub-system to compensate for memory device degradation, in accordance with an example embodiment. Method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by memory controller 215 of FIGS. 2-3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic can update a setting of a memory device that changes a duty cycle of a signal of the memory device. The setting can include a first value for a first configuration and can subsequently include a second value for a second configuration. The updating can involve the memory controller providing the first value to the memory device to cause the memory device to change the duty cycle of the signal without changing a phase of the signal. The setting can be a timing parameter that affects a falling edge of the signal and can cause the memory device to change the duty cycle of the signal to be closer to a 50% duty cycle. The memory controller can also or alternatively test the values for the settings and one of the values can cause the duty cycle of the signal to be below 50% and another value can cause the duty cycle of the signal to be above 50%. In one example, the setting can be a set of settings of the memory device that includes a first setting that controls a rising edge of a strobe signal and a second setting that controls a falling edge of the strobe signal. The first or second settings can shape the signal (e.g., rising or falling edge) by modifying the rate the voltage of the signal increases, decreases, or a combination thereof.

At operation 620, the processing logic can store error data that indicates errors when using the first configuration and errors when using the second configuration. The processing logic can analyze the stored error data and determine a frequency distribution based on the error data. The frequency distribution can represent quantities of read errors relative to different duty cycles of the signal. The processing logic can select one or more optimum values (e.g., the determined value(s)) based on a data eye of the frequency distribution. The data eye can be a window of the frequency distribution with lower quantities of read errors.

At operation 630, the processing logic can determine a value for the setting based on the error data and the first and second values, wherein the determined value minimizes errors associated with the memory device. In one example, the processing logic can detect a degradation of the memory device by comparing the determined value of the setting and a previously determined value of the setting, as discussed in more detail in regards to method 700.

At operation 640, the processing logic can store the determined value (e.g., current optimum value) for the setting of the memory device. The stored value can be used by method 700, discussed below.

FIG. 7 is a flow chart of a method 700 for measuring the degradation of one or more memory devices of the memory sub-system, in accordance with an example embodiment. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the memory controller 215 of FIG. 5. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic can test different values for a setting of a memory device that affects a duty cycle of a signal internal to the memory device. The different values for the setting of the memory device can include a first value that causes the duty cycle of the signal to be below 50% and a second value that causes the duty cycle of the signal to be above 50%. Testing the different values for the setting of the memory device can include selecting the different values and providing the values to the memory device. The testing can also involve evaluating access to data on the memory device while the memory device is using the first value and the second value. In one example, the evaluation can involve at least one of reading the data, writing the data, and comparing the data.

At operation 720, the processing logic can select an optimum value for the setting based on access errors during the testing and the optimum value minimizes access errors. The processing logic can select the optimum value by determining a frequency distribution based on the access errors and analyzing the frequency distribution to identify a window with little to no access errors. The processing logic can then select a point within the window (e.g., middle point, center point). The setting value that corresponds to the point can be the optimum value.

At operation 730, the processing logic can determine a degradation measurement for the memory device based on the optimum value. In one example, the processing logic can determine the degradation measurement based on one or more mathematical expressions (e.g., formulas, functions, equations) such as: Degradation Measurement=(1−Absolute (OPTrec−OPTinit)/SETmax)*100, as discussed in more detail above in regards to measurement module 504. Processing logic can also or alternatively predict future degradation state of the memory device. In one example, the future degradation state can be based on the degradation measurement and at least one historical degradation measurement. In another example, the future degradation state can be based on the degradation measurement and a plurality of degradation measurements of at least one other memory device controlled by the memory controller.

At operation 740, the processing logic can provide a notification to a host system based on the degradation measurement. Providing the notification can involve the processing logic of the memory controller transmitting a message to a host system to indicate a degradation state of the memory device. In another example, the processing logic can compare the degradation measurement to a threshold (e.g., a predetermined notification threshold value). Responsive to the threshold being satisfied, the processing logic can initiate a notification that indicates the memory device is in a first degradation state that is healthy. Responsive to the threshold being unsatisfied, the processing logic can initiate a notification that indicates the memory device is in a second degradation state that is unhealthy. In other examples, the processing logic can also or alternatively update a configuration of the memory controller to reduce a rate of degradation of the memory device in response to the degradation measurement satisfying a threshold (e.g., reconfiguration threshold).

Figure 8:
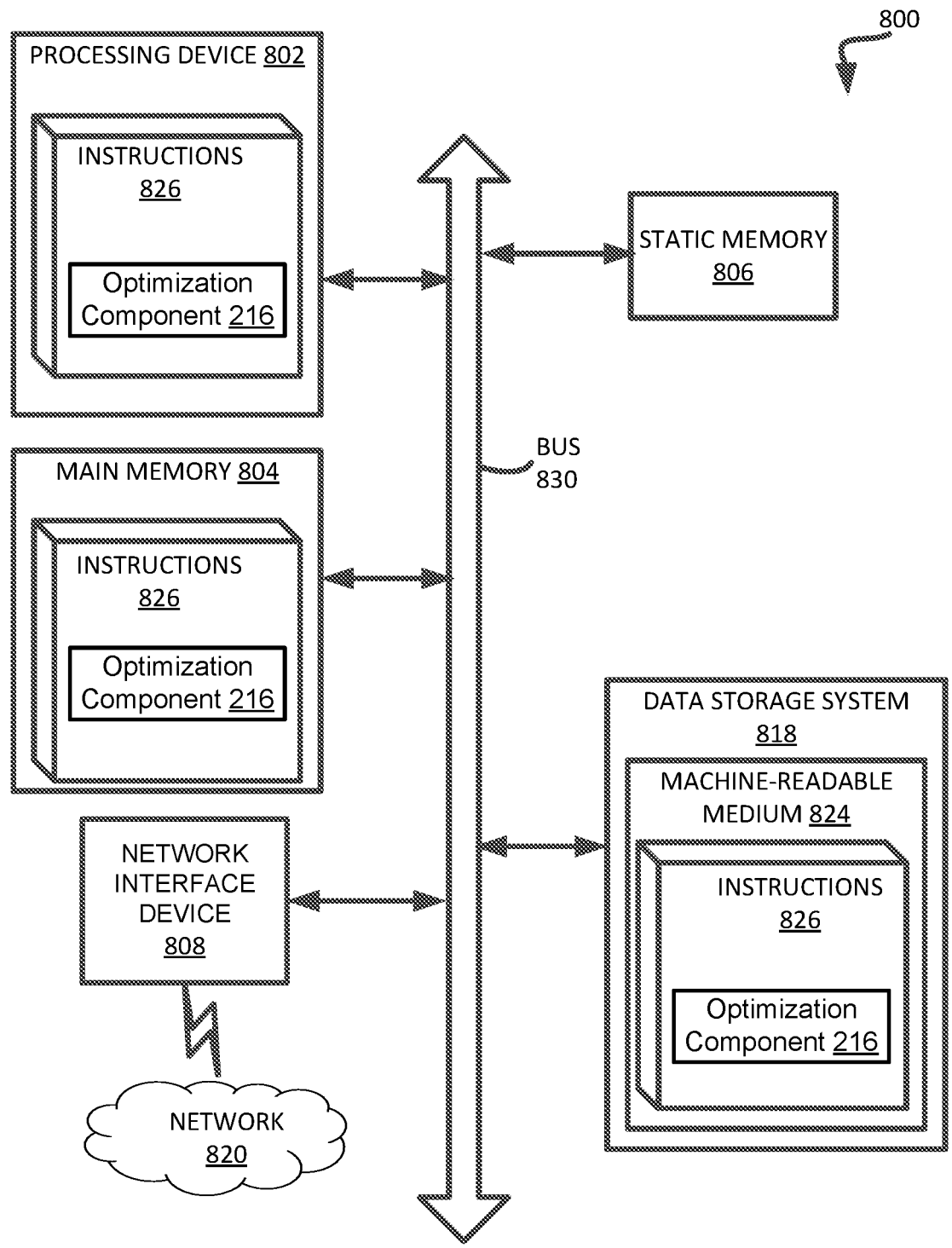
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a memory controller (e.g., the memory controller of FIGS. 2-3, and 5) that includes, is coupled to, or utilizes a memory sub-system (e.g., memory sub-system 110 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to the optimization component 216 of FIGS. 1-3. While the machine-readable storage medium 824 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a memory controller, operatively coupled with the memory device, to perform operations comprising:
updating a setting of the memory device, wherein the setting changes a duty cycle of a signal of the memory device and comprises a first value for a first configuration and comprises a second value for a second configuration;
storing error data that reflects first data access errors when using the first configuration and second data access errors when using the second configuration;
determining a value for the setting based on the error data, wherein the determined value minimizes data access errors associated with the memory device; and
storing the determined value for the setting of the memory device.

2. The system of claim 1, wherein the updating comprises the memory controller providing the first value to the memory device to cause the memory device to change the duty cycle of the signal without changing a phase of the signal.

3. The system of claim 1, wherein the setting is a timing parameter that affects a falling edge of the signal and wherein the determined value causes the memory device to change the duty cycle of the signal to be closer to a 50% duty cycle.

4. The system of claim 1, wherein the updating comprises updating a set of settings of the memory device, wherein the set comprises a first setting that controls a rising edge of a strobe signal and a second setting that controls a falling edge of the strobe signal.

5. The system of claim 1, wherein the operations further comprise detecting, by the memory controller, a degradation of the memory device by comparing the determined value of the setting and a previously determined value of the setting.

6. The system of claim 1, wherein the operations further comprise testing, by the memory controller, a plurality of values for the setting, wherein the plurality of values comprises the first value causing the duty cycle of the signal to be below 50% and the second value causing the duty cycle of the signal to be above 50%.

7. The system of claim 1, wherein the operations further comprise:
determining, by the memory controller, a frequency distribution based on the error data, wherein the frequency distribution represents quantities of read errors relative to different duty cycles of the signal; and
selecting the determined value based on a data eye of the frequency distribution, wherein the data eye is a window of the frequency distribution with lower quantities of read errors.

8. The system of claim 1, wherein the setting of the memory device that changes the duty cycle of the signal comprises a setting that shapes the signal by modifying a rate a voltage of the signal decreases.

9. A method comprising:
updating, by a memory controller, a setting of a memory device, wherein the setting changes a duty cycle of a signal of the memory device and comprises a first value for a first configuration and comprises a second value for a second configuration;
storing error data that reflects first data access errors when using the first configuration and second data access errors when using the second configuration;
determining, by the memory controller, a value for the setting based on the error data, wherein the determined value minimizes data access errors associated with the memory device; and
storing, by the memory controller, the determined value for the setting of the memory device.

10. The method of claim 9, wherein the updating comprises the memory controller providing the first value to the memory device to cause the memory device to change the duty cycle of the signal without changing a phase of the signal.

11. The method of claim 9, wherein the setting is a timing parameter that affects a falling edge of the signal and wherein the determined value causes the memory device to change the duty cycle of the signal to be closer to a 50% duty cycle.

12. The method of claim 9, wherein the updating comprises updating a set of settings of the memory device, wherein the set comprises a first setting that controls a rising edge of a strobe signal and a second setting that controls a falling edge of the strobe signal.

13. The method of claim 9, further comprising detecting, by the memory controller, a degradation of the memory device by comparing the determined value of the setting and a previously determined value of the setting.

14. The method of claim 9, further comprising testing, by the memory controller, a plurality of values for the setting, wherein the plurality of values comprises the first value causing the duty cycle of the signal to be below 50% and the second value causing the duty cycle of the signal to be above 50%.

15. A non-transitory computer-readable medium storing instructions, which when executed by a processing device, cause the processing device to perform operations comprising:
  testing, by a memory controller, different values for a setting of a memory device, wherein the setting changes a duty cycle of a signal of the memory device and comprises a first value for a first configuration and comprises a second value for a second configuration;
  storing error data that reflects first data access errors when using the first configuration and second data access errors when using the second configuration;
  determining, by the memory controller, a particular value for the setting based on the error data, wherein the particular value minimizes data access errors associated with the memory device; and
  updating, by the memory controller, the memory device to comprise the particular value for the setting.

16. The non-transitory computer-readable medium of claim 15, wherein the setting is a timing parameter that affects a falling edge of the signal and wherein the particular value causes the memory device to change the duty cycle of the signal to be closer to a 50% duty cycle.

17. The non-transitory computer-readable medium of claim 15, wherein the testing comprises updating a set of settings of the memory device, wherein the set comprises a first setting that controls a rising edge of a strobe signal and a second setting that controls a falling edge of the strobe signal.

18. The non-transitory computer-readable medium of claim 15, wherein the instructions further comprise detecting, by the memory controller, a degradation of the memory device by comparing the determined value of the setting and a previously determined value of the setting.

19. The non-transitory computer-readable medium of claim 15, wherein the instructions further comprise testing, by the memory controller, a plurality of values for the setting, wherein the plurality of values comprises the first value causing the duty cycle of the signal to be below 50% and the second value causing the duty cycle of the signal to be above 50%.

20. The non-transitory computer-readable medium of claim 15, wherein the setting of the memory device that changes the duty cycle of the signal comprises a setting that shapes the signal by modifying a rate a voltage of the signal decreases.

* * * * *